United States Patent
Tanaka (10) Patent No.: US 9,257,608 B2
(45) Date of Patent: Feb. 9, 2016

(54) NITRIDE SEMICONDUCTOR LIGHT EMITTING DEVICE

(71) Applicant: KABUSHIKI KAISHA TOSHIBA, Tokyo (JP)

(72) Inventor: Akira Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/188,373

(22) Filed: Feb. 24, 2014

(65) Prior Publication Data

US 2015/0076443 A1 Mar. 19, 2015

(30) Foreign Application Priority Data

Sep. 13, 2013 (JP) .................................. 2013-191178

(51) Int. Cl.
| | |
|---|---|
| H01L 33/32 | (2010.01) |
| H01L 33/14 | (2010.01) |
| H01L 33/38 | (2010.01) |
| H01L 33/50 | (2010.01) |
| H01L 33/20 | (2010.01) |

(52) U.S. Cl.
CPC ................ *H01L 33/32* (2013.01); *H01L 33/14* (2013.01); *H01L 33/382* (2013.01); *H01L 33/20* (2013.01); *H01L 33/50* (2013.01)

(58) Field of Classification Search
USPC .......................................................... 257/13
See application file for complete search history.

(56) References Cited

U.S. PATENT DOCUMENTS

| | | | |
|---|---|---|---|
| 5,585,957 A | 12/1996 | Nakao et al. | |
| 7,420,218 B2* | 9/2008 | Nagai | 257/98 |
| 8,513,687 B2* | 8/2013 | Katsuno et al. | 257/98 |
| 8,847,271 B2* | 9/2014 | Katsuno et al. | 257/99 |
| 2004/0004223 A1* | 1/2004 | Nagahama et al. | 257/74 |
| 2008/0048176 A1 | 2/2008 | Orita et al. | |
| 2011/0013659 A1* | 1/2011 | Takeuchi et al. | 372/45.01 |
| 2011/0204411 A1* | 8/2011 | Nago et al. | 257/103 |
| 2013/0153857 A1* | 6/2013 | Tanaka | 257/13 |
| 2013/0181187 A1* | 7/2013 | Tanaka et al. | 257/13 |
| 2013/0228742 A1* | 9/2013 | Tanaka et al. | 257/13 |
| 2013/0248910 A1* | 9/2013 | Kimura et al. | 257/98 |
| 2013/0285011 A1* | 10/2013 | Kojima et al. | 257/13 |
| 2014/0014895 A1* | 1/2014 | Tanaka | 257/13 |
| 2014/0042472 A1* | 2/2014 | Kobayashi | 257/98 |
| 2014/0054543 A1* | 2/2014 | Jeong | 257/13 |

FOREIGN PATENT DOCUMENTS

| | | | |
|---|---|---|---|
| JP | H07015037 A | 1/1995 | |
| JP | H07231144 A | 8/1995 | |
| JP | H07254731 A | 10/1995 | |
| JP | H10303502 A | 11/1998 | |
| JP | 2003243709 A | 8/2003 | |
| JP | 2006128202 A | 5/2006 | |

(Continued)

*Primary Examiner* — Jarrett Stark
*Assistant Examiner* — Charles N Ausar-El
(74) *Attorney, Agent, or Firm* — Patterson & Sheridan, LLP (57) ABSTRACT

A light emitting device includes a first layer of a first conductivity type, a second layer of a second conductivity type, a light emitting layer between the first and second layers, a first electrode disposed on a surface of the first layer, and a second electrode disposed on a surface of the second layer and electrically insulated from the first layer. The first layer has first and second regions, each of which contacts the first electrode. A dopant concentration in the first region is less than a dopant concentration in the second region.

20 Claims, 8 Drawing Sheets

(56) References Cited

FOREIGN PATENT DOCUMENTS

| | | |
|---|---|---|
| JP | 2006245230 A | 9/2006 |
| JP | 2007250788 A | 9/2007 |
| JP | 2007529879 A | 10/2007 |
| JP | 2008053602 A | 3/2008 |
| JP | 2008270665 A | 11/2008 |
| JP | 2009170655 A | 7/2009 |
| JP | 2011181576 A | 9/2011 |
| JP | 2012074748 A | 4/2012 |
| JP | 2012-124330 A | 6/2012 |
| WO | 2007105791 A1 | 9/2007 |

* cited by examiner

NITRIDE SEMICONDUCTOR LIGHT EMITTING DEVICE

CROSS-REFERENCE TO RELATED APPLICATION

This application is based upon and claims the benefit of priority from Japanese Patent Application No. 2013-191178, filed Sep. 13, 2013, the entire contents of which are incorporated herein by reference.

FIELD

Embodiments described herein relate generally to a nitride semiconductor light emitting device.

BACKGROUND

Nitride semiconductor light emitting devices are widely used in illuminating devices, video displays, signals transmission, and so on. In these applications, semiconductor light emitting devices having low operating voltages and high optical outputs are generally preferred.

In nitride semiconductor light emitting devices, it is common to provide a p-side electrode and an n-side electrode on a same side of a semiconductor laminate on a surface having a stepped portion, that is a surface with different levels, and use the other side of the laminate as the emission side (i.e., the light output side) of a light emitting device.

When charge carriers are intensively injected into a narrow area of a light emitting layer close to the p-side electrode and the n-side electrode, Auger non-radiative recombination and carrier overflow increases. For this reason, the luminous efficiency decreases, and thus high optical output is not obtained, and the operating voltage becomes higher.

Further, when carriers are concentrated in sub-portions of the light emitting layer, other problems may occur, for example, chromaticity is different between the central portion and peripheral portion of a chip, and color irregularity occurs.

DETAILED DESCRIPTION

Embodiments provide a nitride semiconductor light emitting device having less color irregularity and higher optical output.

In general, according to one embodiment, a nitride semiconductor light emitting device includes a first layer having a first conductivity type, a second layer having a second conductivity type, a light emitting layer between the first layer and the second layer, the light emitting layer including a nitride semiconductor material, a first electrode disposed on a surface of the first layer, and a second electrode disposed on a surface of the second layer and electrically insulated from the first layer. The first layer has first and second regions each contacting the first electrode. A dopant concentration in the first region is less than a dopant concentration in the second region.

Hereinafter, example embodiments of the present disclosure will be described with reference to the accompanying drawings.

Figure 1A:
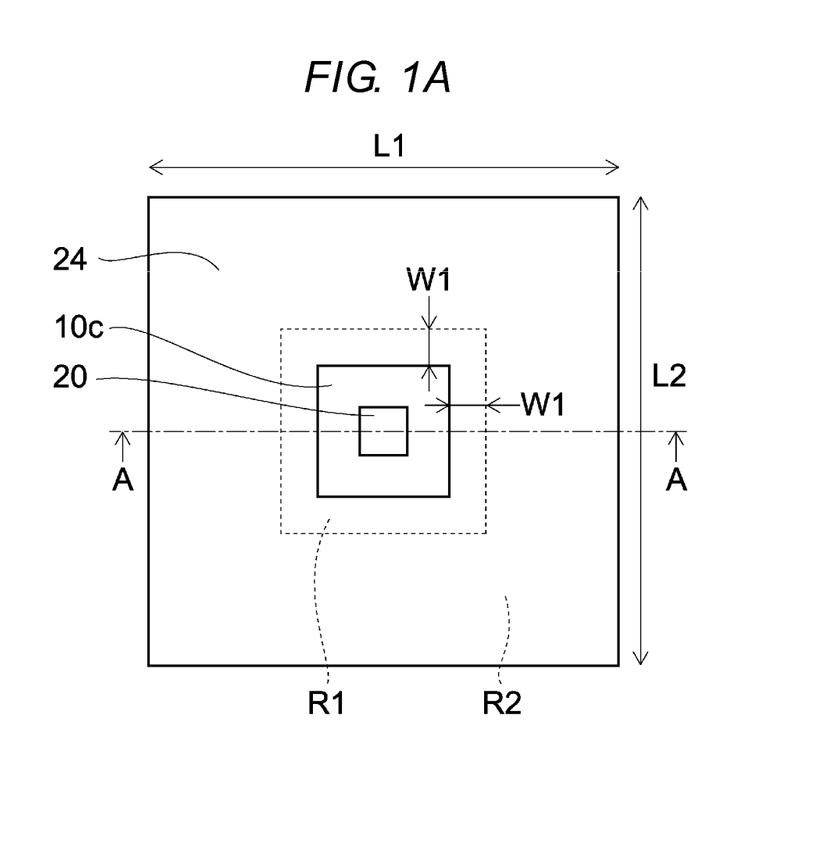
FIG. 1A is a schematic bottom view illustrating a nitride semiconductor light emitting device according to a first embodiment.
Figure 1B:
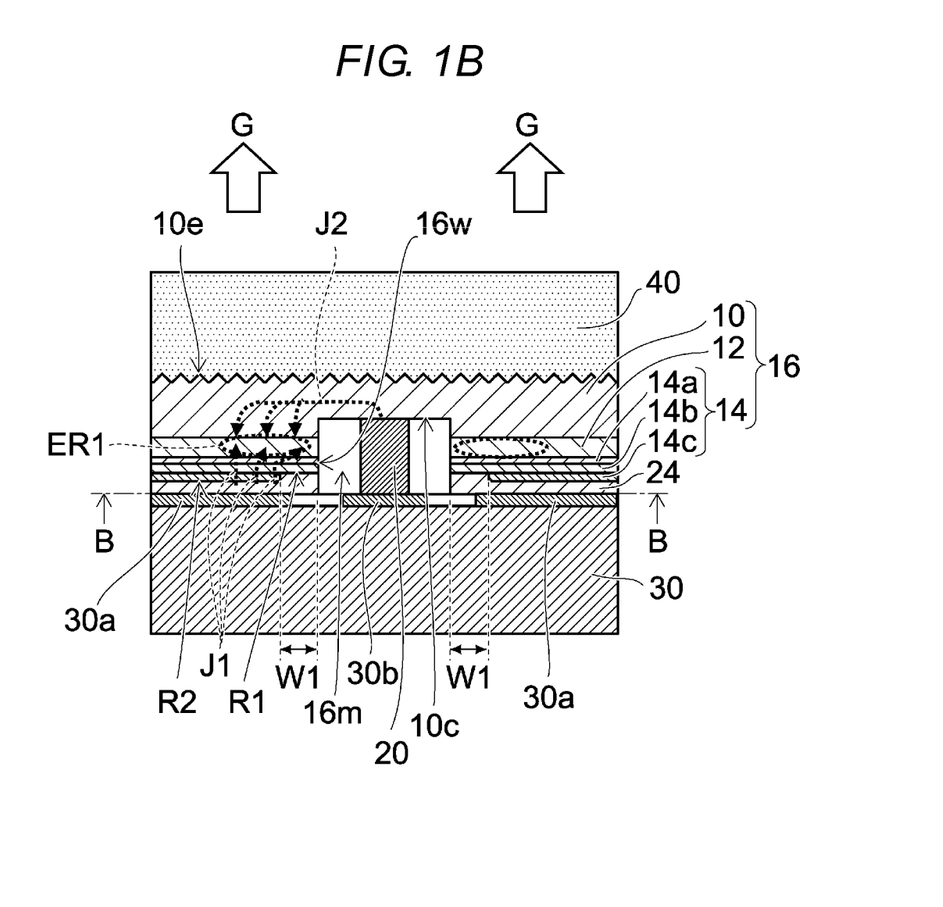
FIG. 1B is a schematic cross-sectional view taken along a line A-A of FIG. 1A.

FIG. 1A is a schematic bottom view illustrating a nitride semiconductor light emitting device according to a first embodiment, and FIG. 1B is a schematic cross-sectional view taken along a line A-A of FIG. 1A. Also, FIG. 1A is a schematic bottom view taken along a line B-B of FIG. 1B. The nitride semiconductor light emitting device includes a laminate 16, a first electrode 24, a second electrode 20, and a phosphor layer 40.

The laminate 16 includes a first layer 14 including a first-conductive-type layer, a second layer 10 including a second-conductive-type layer, and a light emitting layer 12 provided between the first layer 14 and the second layer 10, and contains a nitride semiconductor. Also, at the central portion of the laminate 16, a step portion 16m is formed from the surface of the first layer 14 up to a portion of the second layer 10. The step portion 16m has an inner wall 16w and a bottom 10c.

The surface of the first layer 14 opposite to the light emitting layer 12 includes a first area R1 and a second area R2. The first area R1 is provided on the step portion (16m) side of the laminate 16, and is adjacent to the inner wall 16w. Also, the second area R2 is provided to surround the outer side of the first area R1.

The first electrode 24 is provided on the surface of the first layer 14, and reflects light emitted from the light emitting layer 12. When a portion of the first electrode 24 on the surface side of the first layer 14 contains silver (Ag), it is possible to obtain high optical reflectance even with respect to blue light. Also, the second electrode 20 is connected to the bottom 10c of the step portion 16m, and is surrounded by the light emitting layer 12 and the first electrode 24.

Carriers J1 injected from the first electrode 24 into the surface of the first layer 14 are supplied to the light emitting layer 12. Meanwhile, carriers J2 injected from the second electrode 20 spread in a transverse direction, and are thereby supplied to the light emitting layer 12. As shown in FIG. 1B, a portion of light is emitted upward from a light emitting area ER1 of the light emitting layer 12. Another portion of the light is emitted in a downward direction, and is reflected upward by the first electrode 24.

Also, the phosphor layer 40 absorbs the emitted light (referred to as the "emitted light") from the light emitting layer 12, and then emits light (wavelength converted light) having a wavelength longer than the wavelength of the absorbed light. The phosphor layer 40 can be formed by mixing Yttrium-Aluminum-Garnet (YAG) phosphor particles or the like in a transparent resin liquid, applying the mixture, and then performing thermal curing or the like. Using the phosphor layer 40, it is possible to obtain white light or the like as mixed light G from the light emitted from the light emitting layer 12 and the wavelength converted light from the phosphor layer 40. In a case where the emitted light has a wavelength in a range of 430 nm to 480 nm, the phosphor layer 40 can be formed of a yellow phosphor, a red phosphor, a green phosphor, or the like.

Also, in an embodiment, a length L1 of one side of the nitride semiconductor light emitting device can be set to 0.5 mm, and a length L2 of another side can be set to 0.5 mm, and can be set to other values. In other embodiments, the side length L1 and the side length L2 may be different from each other and neither L1 nor L2 must be set to 0.5 mm.

The nitride semiconductor light emitting device can further include a support 30. The support 30 includes, for example, a third electrode 30a and a fourth electrode 30b. By wafer bonding, the first electrode 24 on the surface of the laminate 16 (formed, for example, on a substrate by crystal growth) and the third electrode 30a of the support 30 can be bonded, and the second electrode 20 and the fourth electrode 30b of the support 30 can also be bonded. After the wafer bonding, it is possible to remove the substrate used for crystal growth— that is, it is possible to remove a substrate upon which the first electrode 24 was initially grown rather than to keep the substrate in the layer stack of the light emitting element.

The structure of the laminate 16 will be described. In the following description, it is assumed that the first layer 14 includes a p-type layer, and the second layer 10 includes an n-type layer. However, the present disclosure is not limited to those conductive types.

The laminate 16 is formed by growing crystal on a substrate for growing a crystal of sapphire, silicon, or the like, by metal-organic chemical vapor deposition (MOCVD) or the like. The laminate 16 includes the first layer 14, the second layer 10, and the light emitting layer 12 provided between the first layer 14 and the second layer 10.

The second layer 10 includes, for example, an n-type GaN cladding layer having a donor concentration of $1 \times 10^{19}$ cm$^{-3}$ and a thickness of 4 μm, for example, and a superlattice layer including, for example, 30 pairs of well layers and barrier layers, the well layers having thicknesses of 1 nm and the barrier layers having thicknesses of 3 nm. The superlattice layer is formed of InGaN/InGaN, for example. The superlattice layer may be an undoped layer. Also, provision of the superlattice layer makes it possible to improve the crystallinity of the nitride semiconductor likely to be lattice-mismatched.

The light emitting layer 12 may have a multi-quantum well (MQW) structure including well layers which are formed of $In_xGa_yAl_{1-x-y}N$ (wherein 0<x<1, 0<Ga<1, and 0<x+y≤1), and barrier layers which are formed of $In_xGa_yAl_{1-x-y}N$ (wherein 0≤x<1, 0<Ga<1, and 0<x+y≤1). The MQW structure may be composed of 5.5 pairs of well layers having thicknesses of 3 nm and barrier layers having thicknesses of 5 nm. The wavelength of the emitted light can be set to, for example, 430 nm to 480 nm.

The first layer 14 of this embodiment includes an overflow preventing layer 14a (where an acceptor concentration is $1 \times 10^{20}$ cm$^{-3}$ and whose thickness is 5 nm), a p-type GaN cladding layer 14b (where an acceptor concentration is $1 \times 10^{20}$ cm$^{-3}$ and whose thickness is 85 nm), a p+-type GaN contacting layer 14c (where an acceptor concentration is $1 \times 10^{21}$ cm$^{-3}$ and whose thickness is 5 nm), and the like, which are formed of, for example, p-type AlGaN.

The laminate 16 has the step portion 16m formed concavely from the surface of the first layer 14 up to a portion of the second layer 10 at a central portion in the plane of laminate 16. The bottom 10c of the step portion 16m may be embedded on the n-type GaN cladding layer of the second layer 10. On the bottom 10c of the step portion 16m, the second electrode 20 is provided.

A portion of the p+-type GaN contacting layer 14c on the surface of the first layer 14 that is nearest to the step portion (16m) is removed by etching or the like such that the p-type cladding layer 14b (which has a lower acceptor concentration than layer 14c) is exposed. Then, the exposed surface of the p-type cladding layer 14b is the first area R1 and the surface of the remaining p+-type GaN contacting layer 14c is the second area R2.

The dopant concentration of the first area R1 is lower than the dopant concentration of the second area R2. Therefore, it is possible to make a current density based on carriers injected from the first electrode 24 into the first area R1 (that is into p-type cladding layer 14b) lower than a current density based on carriers injected from the first electrode 24 into the second area R2 (that is into p+-type GaN contacting layer 14c). As a result, the distribution of a carrier density does not become steeply and excessively high in the vicinity of the second electrode 20, and it is possible to provide a wide light emitting area ER1. Also, non-radiative Auger recombination and carrier overflow are suppressed, and it is possible to improve the luminous efficiency and the optical output.

Further, Auger recombination gives energy generated by recombination to other carriers, thereby causing non-radiative recombination, resulting in a reduction in the luminous efficiency. Further, Auger recombination probability increases as an electron concentration or a hole concentration increases. As a result, a reduction in the luminous efficiency in a high-current operation is suppressed, and it is possible to further improve the optical output.

Further, in a case where the second electrode 20 is set as the n-side electrode, it is possible to spread electrons which have a mobility higher than that of holes, into a wider range of the light emitting layer 12. Meanwhile, since the first electrode 24 (as the p-side electrode) is provided to widely cover the surface of the light emitting layer 12 and has a short running distance up to the light emitting layer 12, the first electrode 24 will spread holes having mobility lower than that of electrons into the light emitting layer 12. Therefore, it is possible to further improve the luminous efficiency. As a result, it is possible to further improve the optical output in a high-current operation.

Further, to make the second layer 10 have a predetermined thickness, a surface 10e of the second layer 10 opposite to the light emitting layer 12 is thinned by etching or the like. On the etched surface 10e, it is preferable to form minute irregularities (roughness) to thereby reduce internal reflections and to improve light-extraction efficiency. The minute irregularities on the surface 10e causes the interface between the second layer 10 and the phosphor layer 40 (or any other layer material including air) to not be optically smooth, thus limiting interfacial reflections. When the phosphor layer 40 is formed on the surface 10e having the irregularities, it is possible to provide irregularities on both surfaces of the phosphor layer 40.

Figure 2A:
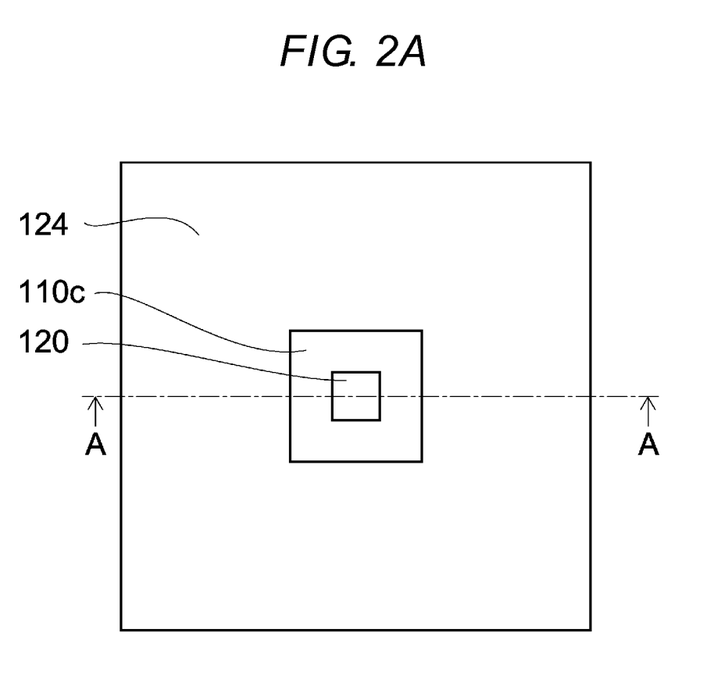
FIG. 2A is a schematic bottom view illustrating a nitride semiconductor light emitting device according to a first comparative example.
Figure 2B:
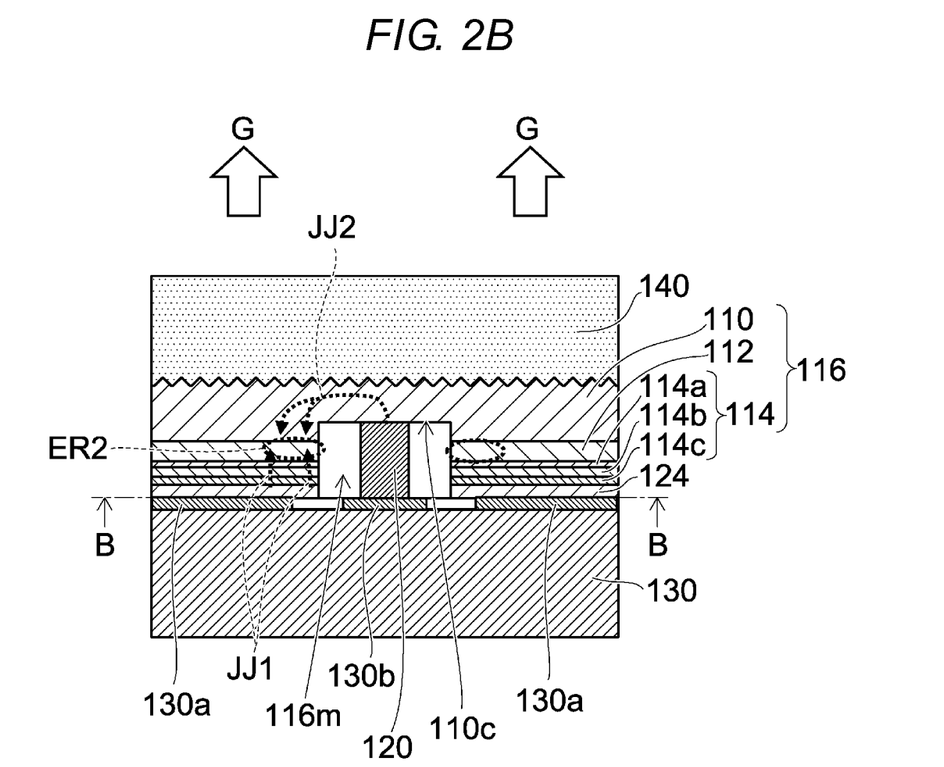
FIG. 2B is a schematic cross-sectional view taken along a line A-A of FIG. 2A.

FIG. 2A is a schematic bottom view illustrating a nitride semiconductor light emitting device according to a first comparative example, and FIG. 2B is a schematic cross-sectional view taken along a line A-A of FIG. 2A.

In the comparative example, a p+-type GaN connecting layer 114c of the surface of a first layer 114 covers the entire surface of a p-type cladding layer 114b. A light emitting area ER2 is a relatively narrow portion of a light emitting layer 112 that is in the vicinity of a second electrode 120. Therefore, a carrier density becomes high in this narrow light emitting area ER2. As a result, Auger recombination and carrier overflow increase, and the luminous efficiency decreases.

Further, since the light emitting area ER2 is biased toward the vicinity of the second electrode 120, a light path up to the peripheral portion of the phosphor layer 140 becomes relatively long when compared to the light path to the central portion of the phosphor layer 140. Therefore, it becomes difficult to uniformly irradiate the central portion and peripheral portion of a phosphor layer 140 due to optical path length differences, and thus color irregularity occurs.

Figure 3A:
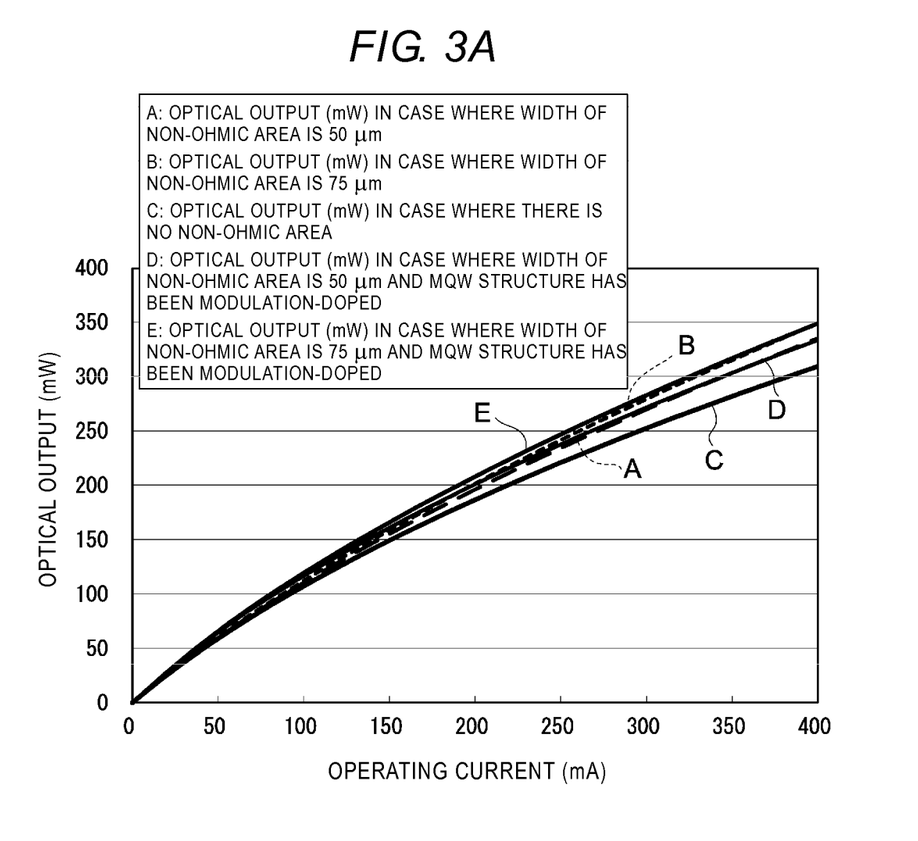
FIG. 3A is a graph illustrating dependence of optical output on operating current obtained by simulations.
Figure 3B:
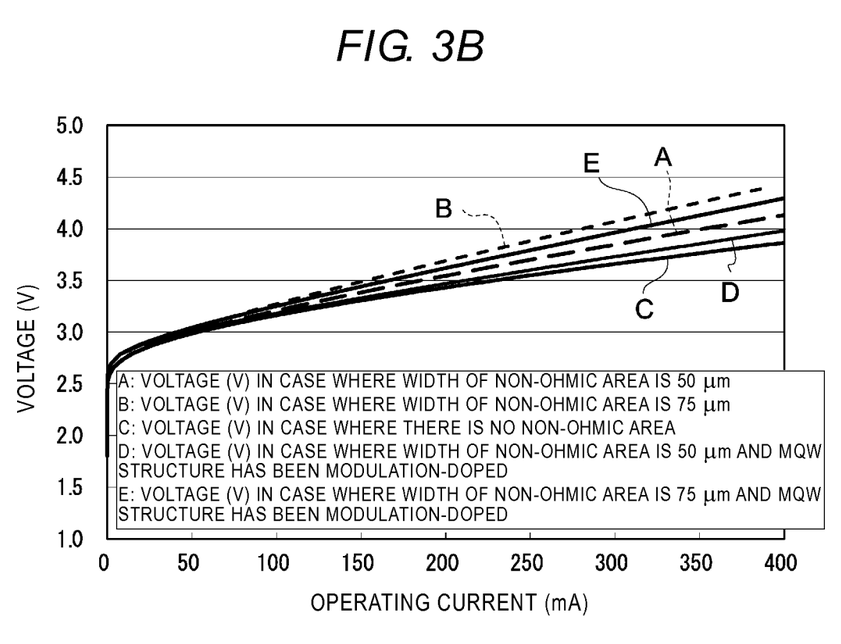
FIG. 3B is a graph illustrating dependence of voltage on operating current obtained by simulations.

FIG. 3A is a graph illustrating dependence of optical output on operating current obtained by simulations, and FIG. 3B is a graph illustrating dependence of voltage on operating current obtained by simulations.

A case where a width W1 of the first area R1 (the non-ohmic contact area) in the first embodiment is 50 μm is shown by a curved line A. A case where the width W1 of the first area R1 in the first embodiment is 75 μm is shown by a curved line B. Also, a case of the comparative example (depicted in FIGS. 2A and 2B) is shown by a curved line C. Curved lines D and E will be described below.

In FIG. 3A, the vertical axis represents optical output in milliwatts (mW) and the horizontal axis represents operating current in milliamperes (mA). When the operating current is 400 mA, the optical output of the comparative example shown by the curved line C is about 305 mW. Meanwhile, the optical output of the first embodiment (wherein the width W1 is 50 μm) shown by the curved line A is 330 mW (which is about 8% greater than the output of the comparative example), and the optical output of the first embodiment (wherein the width W1 is 75 μm) shown by the curved line B is 350 mW (which is about 15% greater than the output of the comparative example). That is, when the first area R1 is provided, it is possible to improve the optical output to by at least about 8% to 15%.

In FIG. 3B, the vertical axis represents voltage (V) and the horizontal axis represents operating current (mA). When the operating current is 400 mA, the voltage of the comparative example shown by the curved line C is about 3.85 V. Meanwhile, the voltage of the first embodiment (wherein the width W1 is 50 μm) shown by the curved line A is 4.15 V (about 8% greater than the comparative example), and the voltage of the first embodiment (wherein the width W1 is 75 μm) shown by the curved line B is 4.4V (about 14% greater than the comparative example). When the width W1 of the first area R1 is increased, the voltage increases.

In a second embodiment, a MQW structure constituting a light emitting layer 12 is modulation-doped. For example, barrier layers are doped with donors. The dopant concentrations thereof can be set to $2\times10^{18}$ $cm^{-3}$ or the like.

A case where a width W1 of a first area R1 in the second embodiment is 50 μm is shown by a curved line D in FIGS. 3A and 3B. Also, a case where the width W1 of the first area R1 in the second embodiment is 75 μm is shown by a curved line E.

As shown in FIG. 3A, the curved line A and the curved line D almost coincide with each other. Also, the curved line B and the curved line E almost coincide with each other. That is, the optical output barely depends on whether modulation-doping has been performed on the light emitting layer 12. Meanwhile, the voltage of the second embodiment in the case where the width W1 is 50 μm, shown by the curved line D, is about 4V (about 4% greater than the comparative example), and the voltage of the second embodiment in the case where the width W1 is 75 μm, shown by the curved line E, is about 4.3 V (about 12% greater than the comparative example).

When the barrier layers are modulation-doped, it is possible to reduce an increase in the voltage of the light emitting layer. That is, modulation-doping makes it easy for carriers (electrons) injected from the barrier layers to spread over the entire in-plane area of each well layer of the MQW structure. Therefore, an area where radiative recombination occurs widens, and it is possible to reduce the voltage. As a result, the optical output is improved while an increase in the operating current is suppressed, and it is possible to reduce color irregularity.

Figure 4A:
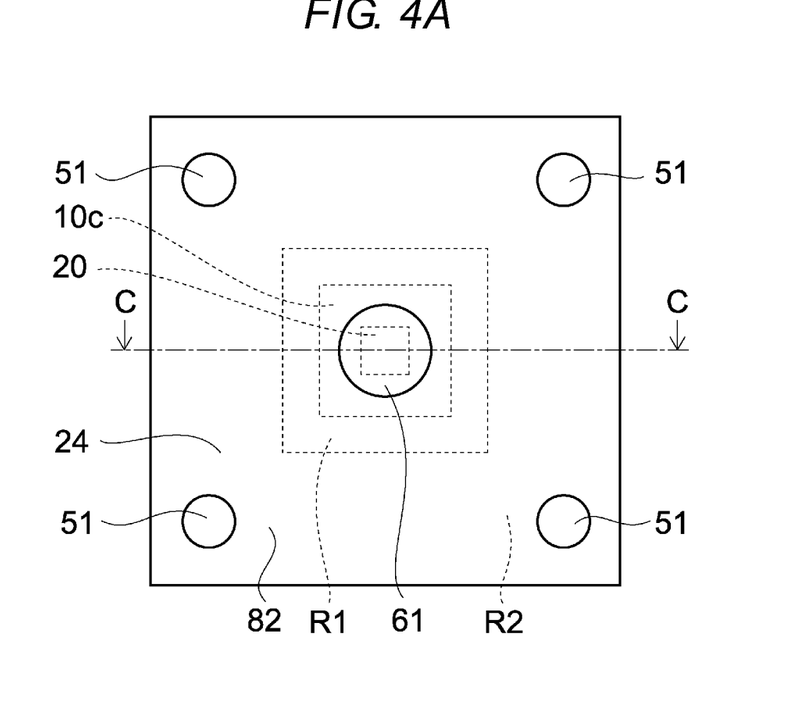
FIG. 4A is a schematic bottom view illustrating a nitride semiconductor light emitting device according to a third embodiment.
Figure 4B:
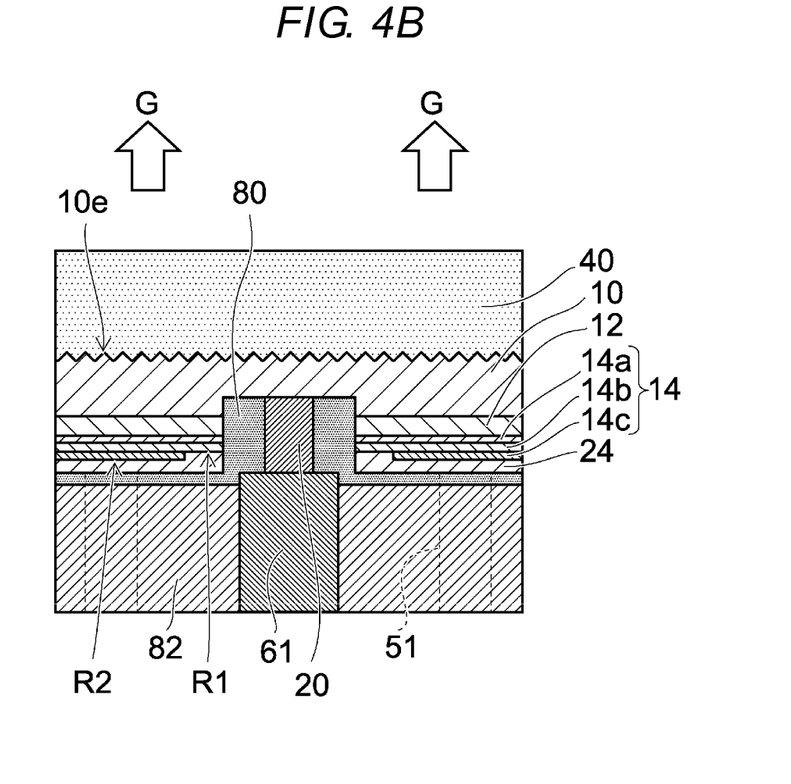
FIG. 4B is a schematic cross-sectional view taken along a line C-C of FIG. 4A.

FIG. 4A is a schematic bottom view illustrating a nitride semiconductor light emitting device according to a third embodiment, and FIG. 4B is a schematic cross-sectional view taken along a line C-C of FIG. 4A.

A laminate 16 and a phosphor layer 40 need not be bonded to a supporting substrate. The laminate 16, a first electrode 24, and a second electrode 20 are provided on a substrate for crystal growth (not specifically depicted) and are covered by an insulating layer 80 or the like. Further, openings are formed in the insulating layer 80 to expose the surfaces of the first electrode 24 and the second electrode 20.

Thereafter, for example, a photoresist or the like is used as a mask to form, by plating or the like, a first pillar electrode 51 and a second pillar electrode 61 of copper or the like such that the first pillar electrode 51 is connected to the first electrode 24 and the second pillar electrode 61 is connected to the second electrode 20. Next, the photoresist or the like is removed, and a reinforcing resin layer 82 or the like is formed.

When the thicknesses of the first pillar electrode 51, the second pillar electrode 61, and the reinforcing resin layer 82 are set to 50 μm to 300 μm, it is possible to improve mechanical strength. Therefore, it is possible to remove the substrate for crystal growth, and to provide the phosphor layer 40 on the exposed surface 10e of the second layer 10. That is, even when bonding to an insulating supporting substrate is not performed, it is possible to perform packaging at a wafer level. Also, the reinforcing resin layer 82 may have a light blocking property.

According to the first to third embodiments, nitride semiconductor light emitting devices having less color irregularity and higher optical output can be provided. These nitride semiconductor light emitting devices can be widely used in illuminating devices, displays, signals, and so on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nitride semiconductor light emitting device, comprising:
    a first layer having a first conductivity type;
    a second layer having a second conductivity type;
    a light emitting layer between the first layer and the second layer, the light emitting layer including a nitride semiconductor material;
    a first electrode disposed on a surface of the first layer; and
    a second electrode disposed on a first surface of the second layer and electrically insulated from the first layer, wherein
    the first layer has a first region contacting the first electrode and having a first dopant concentration, and a second region contacting the first electrode and having a second dopant concentration that is greater than the first dopant concentration, and
    a portion of the first electrode is between the second region and the second electrode in a direction parallel to the first surface.

2. The nitride semiconductor light emitting device according to claim 1, wherein a second surface of the second layer has a phosphor layer disposed thereon, and the second surface of the second layer has surface irregularities.

3. The nitride semiconductor light emitting device of claim 2, wherein a surface of the phosphor layer contacting the second surface of the second layer has surface irregularities.

4. The nitride semiconductor light emitting device of claim 1, wherein the light emitting layer has a multi-quantum well structure including a plurality of pairs of well layers and barrier layers, and the barrier layers are doped with electron donors.

5. The nitride semiconductor light emitting device of claim 4, wherein
the well layers are formed of $In_xGa_yAl_{1-x-y}N$ (where $0<x<1$, $0<y<1$, and $0<x+y\leq1$), and
the barrier layers are formed of $In_xGa_yAl_{1-x-y}N$ (where $0\leq x<1$, $0<y<1$, and $0<x+y\leq1$).

6. The nitride semiconductor light emitting device of claim 1, wherein the second region of the first layer is separated from a recess portion by the first electrode, the recess portion extending from the surface of the first layer through the light emitting layer and into the second layer.

7. A nitride semiconductor light emitting device, comprising:
a first layer having a first conductivity type;
a second layer having a second conductivity type;
a light emitting layer between the first layer and the second layer, the light emitting layer including a nitride semiconductor material;
a recess portion extending from a surface of the first layer through the light emitting layer and into the second layer in a first direction orthogonal to the surface of the first layer;
a first electrode disposed on the surface of the first layer; and
a second electrode disposed on a first surface of the second layer within the recess portion, wherein
the first layer has a first region contacting the first electrode and having a first dopant concentration, and a second region contacting the first electrode and having a second dopant concentration that is greater than the first dopant concentration, and
a portion of the first electrode is between the second region and the recess portion in a second direction perpendicular to the first direction.

8. The nitride semiconductor light emitting device according to claim 7, wherein a second surface of the second layer has a phosphor layer disposed thereon, and the second surface of the second layer has surface irregularities.

9. The nitride semiconductor light emitting device of claim 8, wherein a surface of the phosphor layer contacting the second surface of the second layer has surface irregularities.

10. The nitride semiconductor light emitting device of claim 9, wherein the light emitting layer has a multi-quantum well structure including a plurality of pairs of well layers and barrier layers, and the barrier layers are doped with electron donors.

11. The nitride semiconductor light emitting device of claim 10, wherein
the well layers are formed of $In_xGa_yAl_{1-x-y}N$ (where $0<x<1$, $0<y<1$, and $0<x+y\leq1$), and
the barrier layers are formed of $In_xGa_yAl_{1-x-y}N$ (where $0\leq x<1$, $0<y<1$, and $0<x+y\leq1$).

12. The nitride semiconductor light emitting device of claim 7, wherein the second region of the first layer is separated from the recess portion by the first electrode.

13. A nitride semiconductor light emitting device, comprising:
a first layer having a first conductivity type;
a second layer having a second conductivity type;
a light emitting layer between the first layer and the second layer, the light emitting layer including a nitride semiconductor material;
an insulating portion extending from a surface of the first layer through the light emitting layer and into the second layer in a first direction orthogonal to the surface of the first layer;
a first electrode disposed on the surface of the first layer; and
a second electrode embedded in the insulating portion and electrically contacting the second layer, wherein
the first layer has a first region contacting the first electrode and having a first dopant concentration, and a second region contacting the first electrode and having a second dopant concentration that is greater than the first dopant concentration, and
a portion of the first electrode is between the second region and the insulating portion in a second direction perpendicular to the first direction.

14. The nitride semiconductor light emitting device according to claim 13, wherein a surface of the second layer has a phosphor layer disposed thereon, and the surface of the second layer has surface irregularities.

15. The nitride semiconductor light emitting device of claim 14, wherein a surface of the phosphor layer contacting the surface of the second layer has surface irregularities.

16. The nitride semiconductor light emitting device of claim 13, further comprising:
a first pillar-shaped electrode extending through the insulating film and electrically connected to the first electrode; and
a second pillar-shaped electrode extending through the insulating film and electrically connected to the second electrode.

17. The nitride semiconductor light emitting device of claim 16, further comprising:
a reinforcing resin layer disposed on the insulating film and surrounding the first and second pillar-shaped electrodes.

18. The nitride semiconductor light emitting device of claim 13, wherein the light emitting layer has a multi-quantum well structure including a plurality of pairs of well layers and barrier layers, and the barrier layers are doped with electron donors.

19. The nitride semiconductor light emitting device of claim 18, wherein
the well layers are formed of $In_xGa_yAl_{1-x-y}N$ (where $0<x<1$, $0<y<1$, and $0<x+y\leq1$), and
the barrier layers are formed of $In_xGa_yAl_{1-x-y}N$ (where $0\leq x<1$, $0<y<1$, and $0<x+y\leq1$).

20. The nitride semiconductor light emitting device of claim 13, wherein the second region of the first layer is separated from the insulating portion by the first electrode.

* * * * *